(12) United States Patent
Capodivacca et al.

(10) Patent No.: US 10,203,365 B2
(45) Date of Patent: Feb. 12, 2019

(54) DEVICE TESTING

(71) Applicant: Infineon Technologies AG, Neubiberg (DE)

(72) Inventors: Giovanni Capodivacca, Padua (IT); Adolfo De Cicco, Castel d'Azzano (IT)

(73) Assignee: Infineon Technologies AG, Neubiberg (DE)

( * ) Notice: Subject to any disclaimer, the term of this patent is extended or adjusted under 35 U.S.C. 154(b) by 21 days.

(21) Appl. No.: 14/918,528

(22) Filed: Oct. 20, 2015

(65) Prior Publication Data
US 2016/0109505 A1 Apr. 21, 2016

(30) Foreign Application Priority Data

Oct. 20, 2014 (DE) .................. 10 2014 115 204

(51) Int. Cl.
*G01R 31/02* (2006.01)
*G01R 31/26* (2014.01)

(52) U.S. Cl.
CPC ..... *G01R 31/2621* (2013.01); *G01R 31/2642* (2013.01); *G01R 31/025* (2013.01)

(58) Field of Classification Search
None
See application file for complete search history.

(56) References Cited

U.S. PATENT DOCUMENTS

| | | | | |
|---|---|---|---|---|
| 4,408,304 A * | 10/1983 | Nishizawa | ............ | G11C 11/402 257/306 |
| 4,999,813 A * | 3/1991 | Ohtsuka | ................ | G11C 29/50 365/185.11 |
| 6,128,219 A * | 10/2000 | Pio | ........................ | G11C 16/34 365/185.05 |
| 6,512,714 B2 * | 1/2003 | Hanzawa | ............ | G11C 11/4099 365/185.21 |
| 6,831,866 B1 * | 12/2004 | Kirihata | ................... | G11C 7/12 365/189.06 |
| 2007/0297262 A1 * | 12/2007 | Hara | ...................... | G11C 29/12 365/226 |
| 2015/0042372 A1 | 2/2015 | Pan et al. | | |

FOREIGN PATENT DOCUMENTS

| | | |
|---|---|---|
| CN | 102928763 A | 2/2013 |
| WO | 2014082438 A1 | 6/2014 |

OTHER PUBLICATIONS

Office Action, in the German language, from counterpart German Application No. 102014115204.2 dated Jul. 6, 2015, 9 pp.
Office Action, in Chinese, from counterpart Chinese Patent Application No. 201510678910, dated Dec. 1, 2017, 7 pp.

* cited by examiner

*Primary Examiner* — Paresh H Patel
(74) *Attorney, Agent, or Firm* — Shumaker & Sieffert, P.A.

(57) ABSTRACT

A device may include a plurality of cells. Each cell may include a field-effect transistor and a switch configured to selectively connect a second contact of the respective field-effect transistor with a common test line of the device. A controller of the device is configured to control the switch to be in a closed position. At least one pin is provided which is configured to apply a stress voltage to a common power line connected to a first contact with the field-effect transistor and to the common test line.

9 Claims, 6 Drawing Sheets

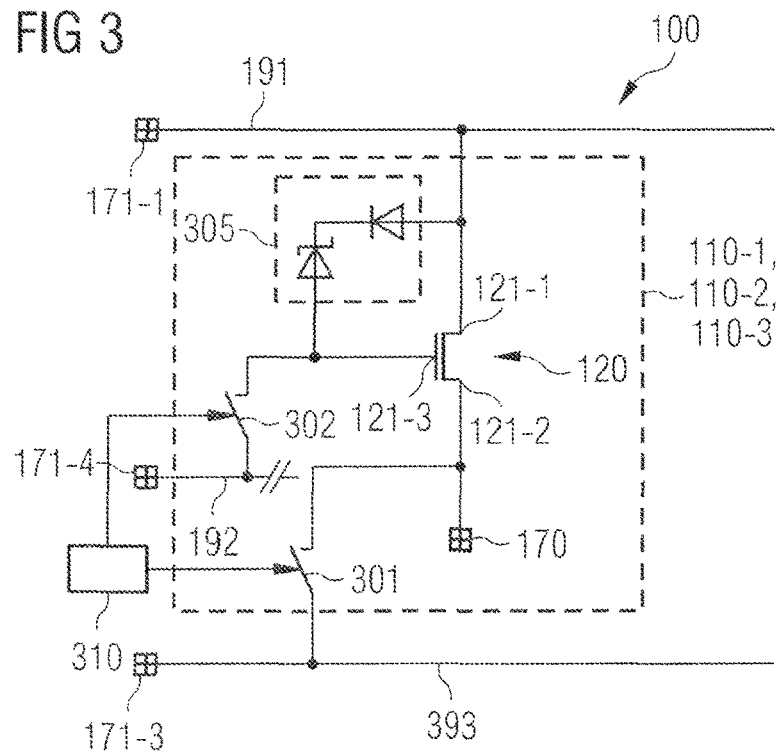
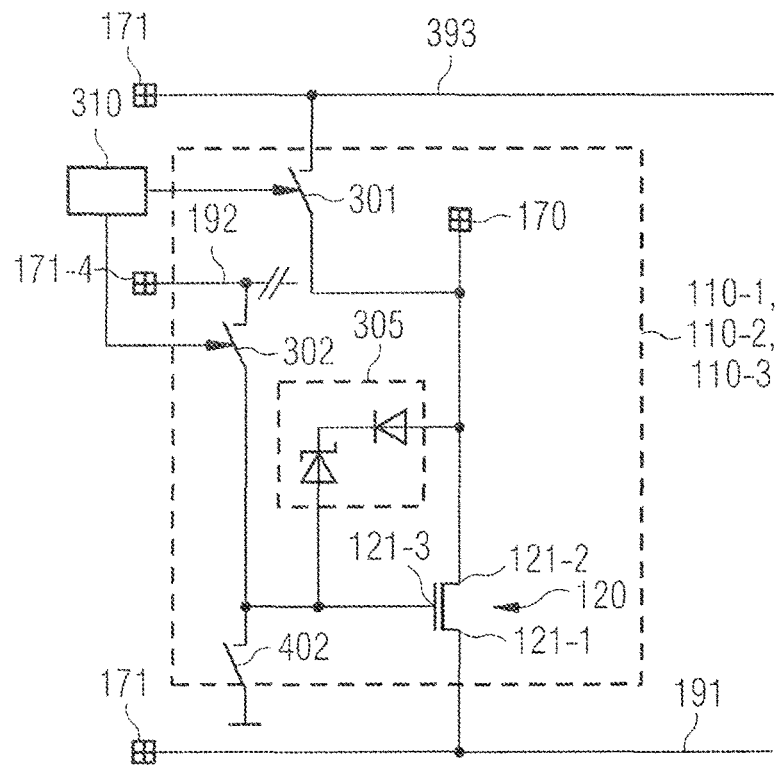

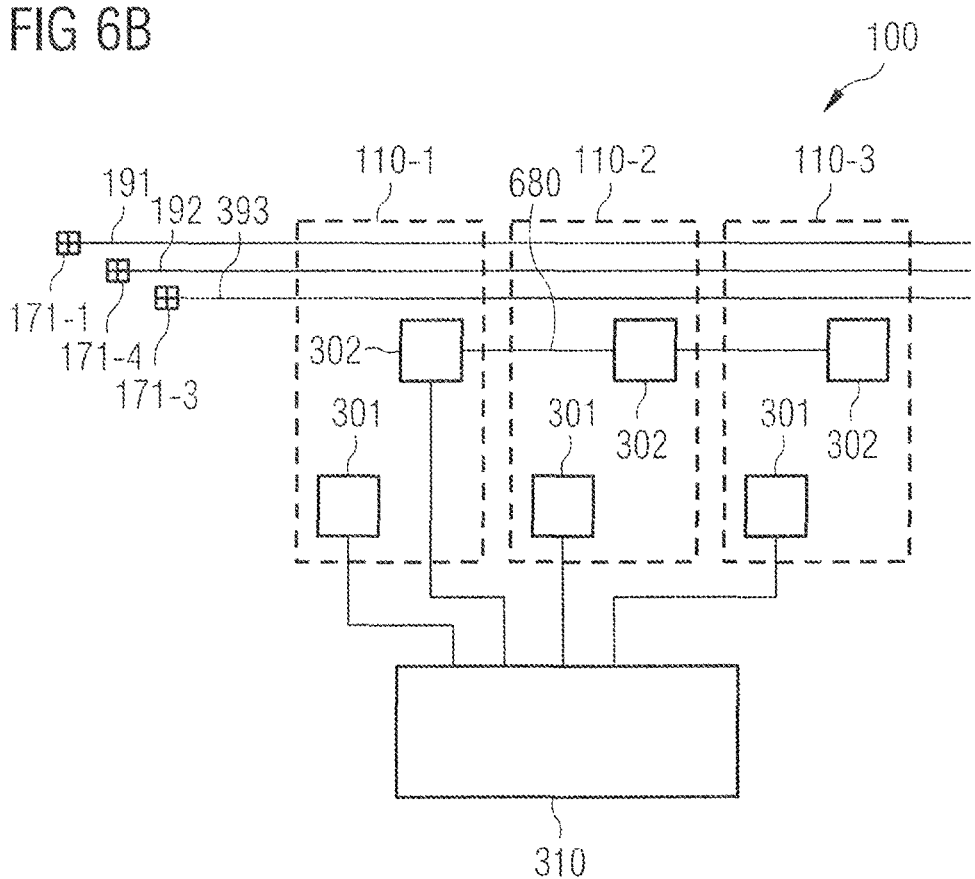

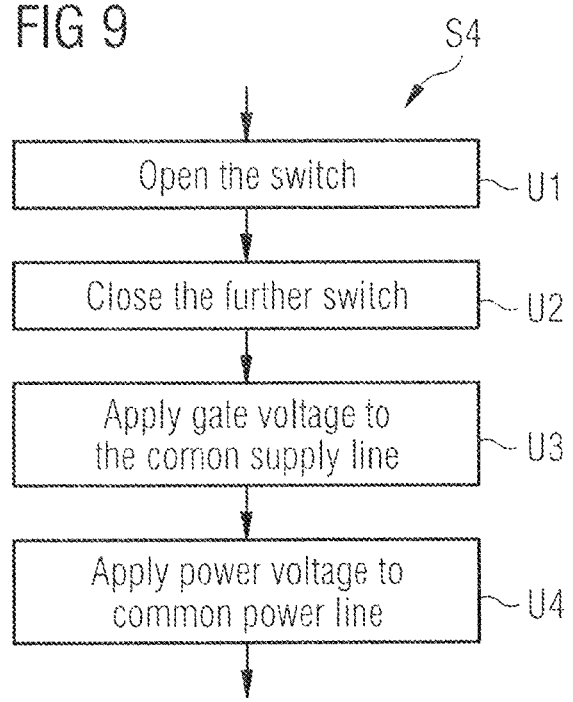

DEVICE TESTING

RELATED APPLICATIONS

The instant application claims priority of German Patent Application No. 102014115204.2, which was filed on Oct. 20, 2014. The entire contents of the identified German Patent Application No. 102014115204.2 are hereby incorporated herein by reference.

BACKGROUND

Scenarios are conceivable where a plurality of loads—such as, e.g., light emitting diodes (LEDs)—are placed in an array and circuitry of a device is provided to individually power each one of the loads. This is typically achieved by providing a cell of the device per load where each cell includes a current source to selectively power the associated load. Typically, the current source includes a field-effect transistor (FET) which acts as a switch for selectively powering the respective load.

Sometimes, it is desirable to test operational reliability of the device. One kind of such test is the gate stress test of the FETs. Here, it is desirable to measure leakage currents between a source contact and a drain contact of each one of the FETs before and after applying a stress voltage.

However, such tests may not be possible or only possible to a limited degree when a comparably large number of cells of a device needs to be tested. Individually contacting each cell, e.g., by means of a needle card or the like, may be cumbersome and subject to failure. Further, there may be a limited amount of space available per cell; also, a distance between neighboring cells may be comparably small. All this makes it time consuming and costly to execute a front-end gate stress test. Therefore, testing before final assembly (front-end testing), e.g. by connecting the loads is technically challenging; when a substrate or wafer on which the device is arranged has not been cut to dimensions which allow testing to be executed, this is further complicated. Executing the gate stress test after final assembly (back-end testing) is expensive, as failing current sources cannot be filtered out at an early production stage.

SUMMARY

Implementations relate to a gate stress test for a device which includes a plurality of cells, where each cell includes a FET to be tested.

According to an aspect, a device is provided. The device includes a common power line, a common test line, and a plurality of cells. Each one of the plurality of cells includes a field-effect transistor and a switch. The field-effect transistor includes a gate, a first contact, and a second contact. The first contact is one of a source and a drain of the field-effect transistor. The first contact is coupled to the common power line. The second contact is the other one of the source and the drain. The switch is configured to selectively couple the second contact of the respective field-effect transistor with the common test line in a closed position. The device further includes a controller. The controller is configured to control the switches of the plurality of cells to be in the closed position. The device further includes at least one pin. The at least one pin is configured to apply a stress voltage to the common power line and the common test line when at least one of the switches is in the closed position.

According to a further aspect, a method of applying a stress voltage to a source and a drain of a plurality of field-effect transistors when executing a gate stress is provided. Each one of the plurality of field-effect transistors is associated with one of a plurality of cells of a device. The method includes for each one of the plurality of cells controlling a switch of the respective cell to be in the closed position. The switch couples one of the source and the drain of the field-effect transistor of the respective cell with a common test line of the device in the closed position. The other one of the source and the drain is coupled to a common power line of the device. The method further includes applying a stress voltage to the common power line and the common test line via at least one pin when at least one of the switches is in the closed position.

It is to be understood that the features mentioned above and features yet to be explained below can be used not only in the respective combinations indicated, but also in other combinations or in isolation, without departing from the scope of the described implementations. Features of the above-mentioned aspects and embodiments may be combined with each other in other embodiments.

The foregoing and additional features and effects of the described implementations will become apparent from the following detailed description when read in conjunction with the accompanying drawings, in which like reference numerals refer to like elements.

BRIEF DESCRIPTION OF THE DRAWINGS

FIG. 3 is a circuit diagram of a device including a plurality of cells according to various embodiments.

FIG. 4 is a circuit diagram of a device including a plurality of cells according to various embodiments.

FIG. 6b is a schematic illustration of a controller configured to control the switches of FIG. 5 for various cells of the device according to various embodiments.

FIG. 9 is a flowchart which illustrates aspects of the method of FIG. 7 relating to normal operation of the device in greater detail.

DETAILED DESCRIPTION

Figure 1:
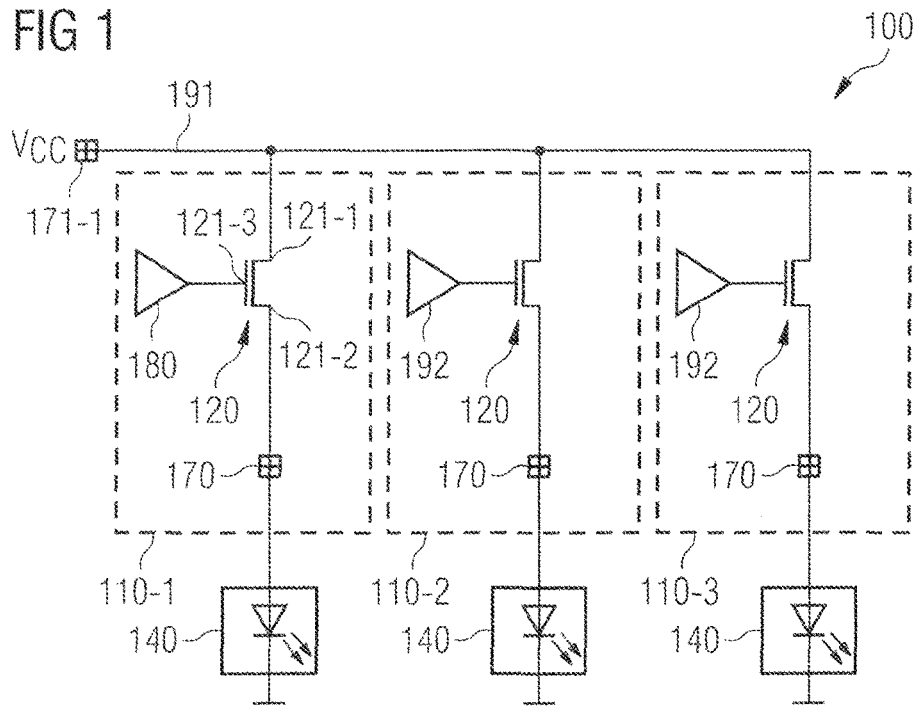
FIG. 1 is a circuit diagram of a device according to a reference implementation

In the following, embodiments will be described in detail with reference to the accompanying drawings. It is to be understood that the following description of embodiments is not to be taken in a limiting sense. The scope of the described implementations is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques are illustrated which enable to execute a gate stress for each one of a plurality of FETs. This may be employed to execute a gate stress test which typically includes, first, measuring a leakage current, second, executing the gate stress, and third, measuring the leakage current. It is then possible to compare the leakage currents measured before and after said executing of the gate stress to assess a quality of the respective FET. Low quality device may have defects in the gate oxide layer. The duration of executing the gate stress may depend on various operating conditions.

In FIG. 1, a reference implementation is shown where a plurality of cells 110-1-110-3 of a device is used to power LEDs 140 connected to the cells 110-1-110-3 via an interface 170. Each one of the cells 110-1-110-3 includes a current source formed by a FET 120. As can be seen from FIG. 1, the FET 120 connects the interface 170 with a power supply line 191 to which a voltage VCC may be applied via a pin 171-1. The FET 120 has three contacts 121-1-121-3. The first and second contacts 121-1 and 121-2 are the source and the drain. The third contact 121-3 is the gate 121-3. A predriver 180 is used to control the gate voltage applied to the gate 121-3. Depending on the gate voltage, the first and second contacts 121-1, 121-2 are inter-connected or disconnected, so that the LED 170 may be selectively powered via the interface.

The device 100 may take various forms. E.g., the device 100 may be configured to selectively power an array of LEDs amounting to, e.g., 1024 pixel. In particular, the array of LEDs may be mounted on top of the device 100 in a chip-on-chip assembly. Then, the device 100 acts as a control circuit of the LEDs for lighting purposes.

Typically, there may be limited building space available for each one of the cells 110-1-110-3. E.g., in the above-mentioned chip-on-chip assembly, as each LED is typically mounted directly on top of the device 100, each cell 110-1-110-3 may be limited to dimensions of 125 μm times 125 μm. Further, a short pitch between neighboring cells 110-1-110-3 may be required. E.g., in the above-mentioned chip-on-chip assembly, increasing the resolution in the in-plane dimensions may be preferable to increase resolution of the LED array and to avoid usage of mechanical components for beam leveling adjustment.

The device 100 as mentioned above has characteristic properties, namely: a large numbers of cells which are placed on a single chip of the device 100; limited dimensions of each cell 110-1-110-3; and limited pitch between neighboring cells 110-1-110-3. This makes execution of a gate stress difficult.

Figure 2:
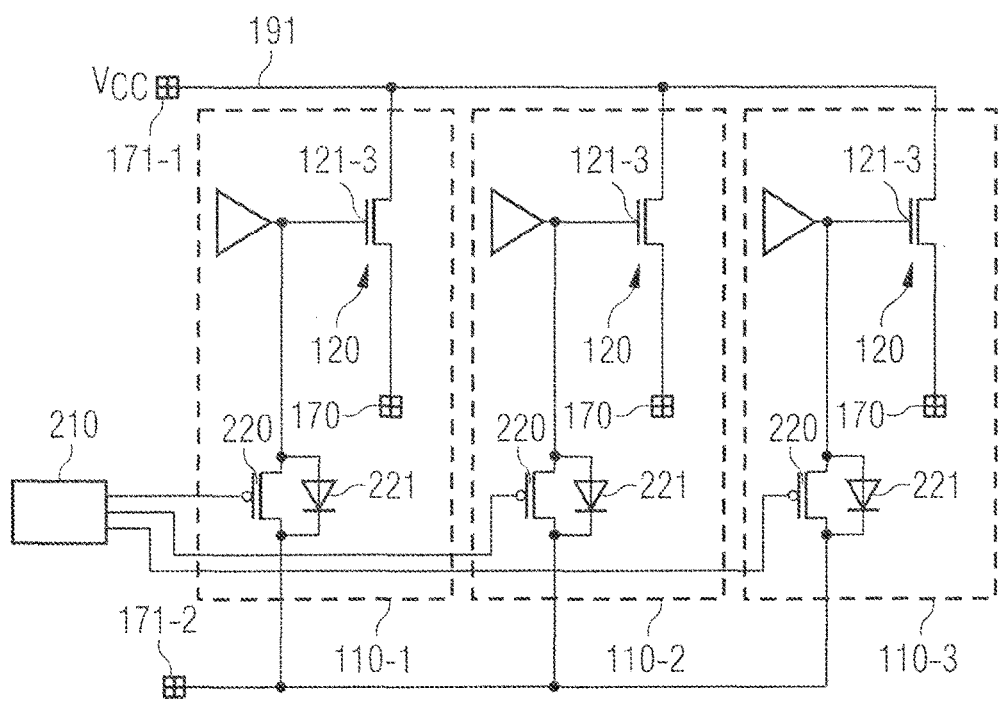
FIG. 2 is a circuit diagram of a device according to a reference implementation, where a gate stress test is possible.

In FIG. 2 a reference implementation of executing the gate stress test is shown. Each gate contact 121-1 of the FETs 120 of the various cells 110-1-110-3 is connected to a common test pin 171-2 via an additional switch 220; here, the additional switch 220 is implemented as a FET controlled by a controller 210. A body diode 221 of the switch 220 is provided. However, such a solution suffers from various drawbacks. Individually connecting a large number of gates 121-3 to the controller 210 requires high efforts in terms of top routing; typically the various gates 121-3 of each cell 110-1-110-3 are not routed to the exterior and therefore, contacting the gate 121-3 to apply the stress voltage may be difficult due to limited accessibility due to the circuit geometry. Selecting the various cells 121-1-121-3 in series requires a large test time for a large number of cells 110-1-110-3.

Such drawbacks are overcome by the scenario of FIG. 3. As can be seen from a comparison of the FIGS. 1 and 2 vs. FIG. 3, additional circuitry is implemented in the device 100 in order to execute the gate stress. In particular, a common test line 393 which is connected to each one of the plurality of the cells 110-1-110-3 is provided. The common test line 393 is accessible via a pin 171-3. Thereby, it becomes possible to execute the gate stress test for the cells 110-1-110-3 by relying on the two pins 171-1, 171-3, namely the pin 171-1 connected to the common power line 191 and the pin 171-3 connected to the common test line 393. This is explained in detail hereinafter.

As can be seen from FIG. 3, each one of the plurality of cells 110-1-110-3 includes a switch 301. The switch 301 selectively couples the second contact 121-2 of the FET 120 with the common test line 393. In order to control the switch 301, a controller 310 is provided. The controller 310 is configured to control the switch 301 to be in the closed position when executing the gate stress test. A stress voltage may be applied to the common power line 191 and the common test line 393 via the pins 171-1, 171-3.

Further, each one of the plurality of cells 110-1-110-3 includes a further switch 302. The further switch 302 selectively couples the gate 121-3 of the FET 120 with a common supply line 192. A reference voltage may be applied to the common supply line 192 via a further pin 171-4. The controller is configured to control the further switch 302 to be in the closed position when executing the gate stress test.

The stress voltage is applied to the common power line 191 and the common test line 393 via the pins 171-1, 171-3.

The reference voltage is applied to the common supply line 192 via the pin 171-4. In such a scenario, the stress voltage therefore is applied to, both, the first and second contacts 121-1, 121-2 of the FETs 120, i.e., to the source and the drain—instead of to the gate 121-3 and one of the two contacts 121-1, 121-3 (see FIG. 2). By applying the stress voltage to, both, the first and second contacts 121-1, 121-2 at the same time, it is ensured that the gate oxide layer of the FET 120 is stressed at both sides of the channel in a similar manner. It is possible that an external voltage source is provided to provide the stress voltage to the pins 171-1, 171-3 and/or to provide the reference voltage to the further pin 171-4.

In this scenario, it is possible to execute the gate stress in parallel for the plurality of cells 110-1-110-3. The controller 310 may be configured to control the switches 301 of the plurality of cells 110-1-110-3 to be in the closed position at least partly in parallel. Likewise, the controller 310 may be configured to control the further switches 302 of the plurality of cells 110-1-110-3 to be in the closed position. In other words, the switches 301 and/or the further switches 302 of the plurality of cells 110-1-110-3 may be controlled to be concurrently in the closed position. Parallel execution of the gate stress may allow to reduce the time required to execute the test (test time). Further, the requirements of top routing to provide additional circuitry to execute the stress test can be reduced. Further, scalability of the number of cells 110-1-110-3 of the device 100 is ensured. However, in general it is also possible to execute the gate stress in serial for the plurality of cells 110-1-110-3.

The circuit of FIG. 3 schematically shows a high-side switch in form of the FET 120 for the load connected to the cell 110-1-110-3 via the interface 170. Namely, the first contact 121-1 of the FET 120 is the drain and the second contact 121-2 of the FET 120 is the source. The first contact 121-1 is connected to common power line 191. The second contact 121-2 is connected to the interface 170. In such a scenario, the reference voltage applied via the common supply line 192 is at ground. The stress voltage applied to the common test line 393 is typically larger than 3 V, preferably larger than 5 V, preferably larger than 7 V. The switch 301 is preferably implemented as an n-channel insulated FET (the switch is shown)

FIG. 4 shows an embodiment in which the device 100 includes a low-side switch for a load connected to the interface 170. The device 100 has a plurality of cells 110-1-110-3 each comprising a FET 120 of the type NMOS. The first contact 121-1 of the FET 120 is the source and the second contact 121-2 of the FET 120 is the drain. The stress voltage is preferably at ground level, i.e., the common power line 191 and the common test line 393 are grounded. The reference voltage applied via the common supply line 192 is preferably chosen to be larger than 3 V, preferably larger than 5 V, more preferably larger than 7 V. In this low-side configuration, the switch 301 is preferably a p-channel insulated gate FET.

Figure 5:
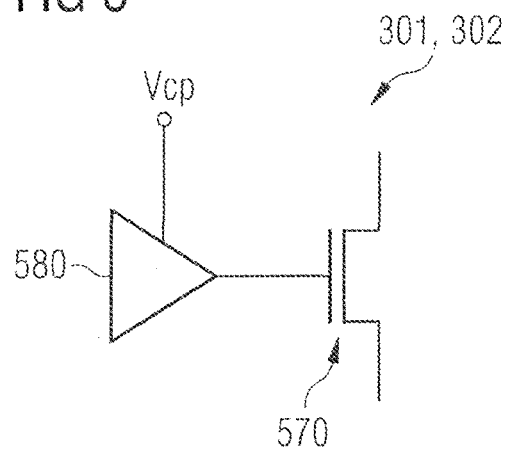
FIG. 5 illustrates a switch employed in the circuit diagrams of FIGS. 3 and 4 for each cell in detail according to various embodiments.

Making reference to FIG. 5, in the high-side configuration the switch 301 may be implemented as an re-channel insulated gate FET 570. Then, it is typically required to drive the switch 301 using a charge-pump voltage 580 as a predriver. Using an n-channel insulated gate FET as the switch 301 in the high-side configuration enables to decrease the circuit area of the cell 110-1-110-3 while keeping a characteristic source-drain resistance when changing the switch 301 from the closed position to the opened position constant. In the low-side configuration the switch 301 is preferably implemented as FET 570 being of a p-channel insulated gate type. Here, the circuit area may be increased.

Making reference again to FIGS. 3 and 4, a clamper circuit 305 is provided between the gate 1221-3 and at least one of the first and second contacts 121-1, 121-2. The clamper circuit 304 includes a Zener diode and a diode connected in series. The clamper circuit 304 is optional; in particular it may not be necessary to provide the clamper circuit 304 in case voltages can be applied directly to the common test line 393 and the common power line 191 and the gate 121-3. However, the clamper circuit 304 may be optionally provided to fix the potential between the gate 121-3 and the respective at least one of the first and second contacts 121-1, 121-2 at a certain value. An external resistance may be provided in series at the common supply line 191 to control a current which flows through the clamper circuit 304. The clamper circuit enables to fix the stress voltage to a defined value; signal drifts are avoided. This allows making the gate stress more reliable.

As mentioned above, by applying the same stress voltage to, both, the source and the drain of the FET 120 via the common power line 191 and the common test line 393 and, e.g., in the high-side configuration forcing the gate 121-3 to zero volt, it is possible to execute the gate stress. A well-know voltage is thereby applied between the first and second contacts 121-1, 121-3 on one side and the gate 121-3 on the other side. This corresponds to operating the device 100 in a gate stress mode.

It is also possible to operate the device 100 in a normal operation mode. In such a scenario, the further switch 302 can be re-used as part of the pre-driver of the FET 120. The further switch 302 may be used to selectively power the load connected to the respective cell 110-1-110-3 via the interface 170 in normal operation mode. The clamper circuit 205 can be re-used as active clamp to protect the gate 121-3 against electric discharge. E.g., the switch 301 is controlled to be in the opened position, i.e., disconnecting the second contact 121-2 of the FET 120 from the common test line 393. The further switch 302 is controlled to be in the closed position and a gate voltage is applied to the common supply line 192.

A control switch 402 is provided; the control switch 402 during gate stress operation mode is controlled to be in the opened position. During normal operation mode, the control switch 402 is in the opened position when the further switch 302 is in the closed position and the control switch 402 is in the closed position when the further switch 302 is in the opened position. The gate voltage is applied to the common supply line 192. Thereby, the first contact 121-1 and the second contact 121-2 of the FET 120 are electrically interconnected. A power voltage is applied to the common power line 191 which powers the load connected to the respective cell 110-1-110-3 via the interface 170. E.g., the power voltage may be provided by an external voltage source.

Figure 6A:
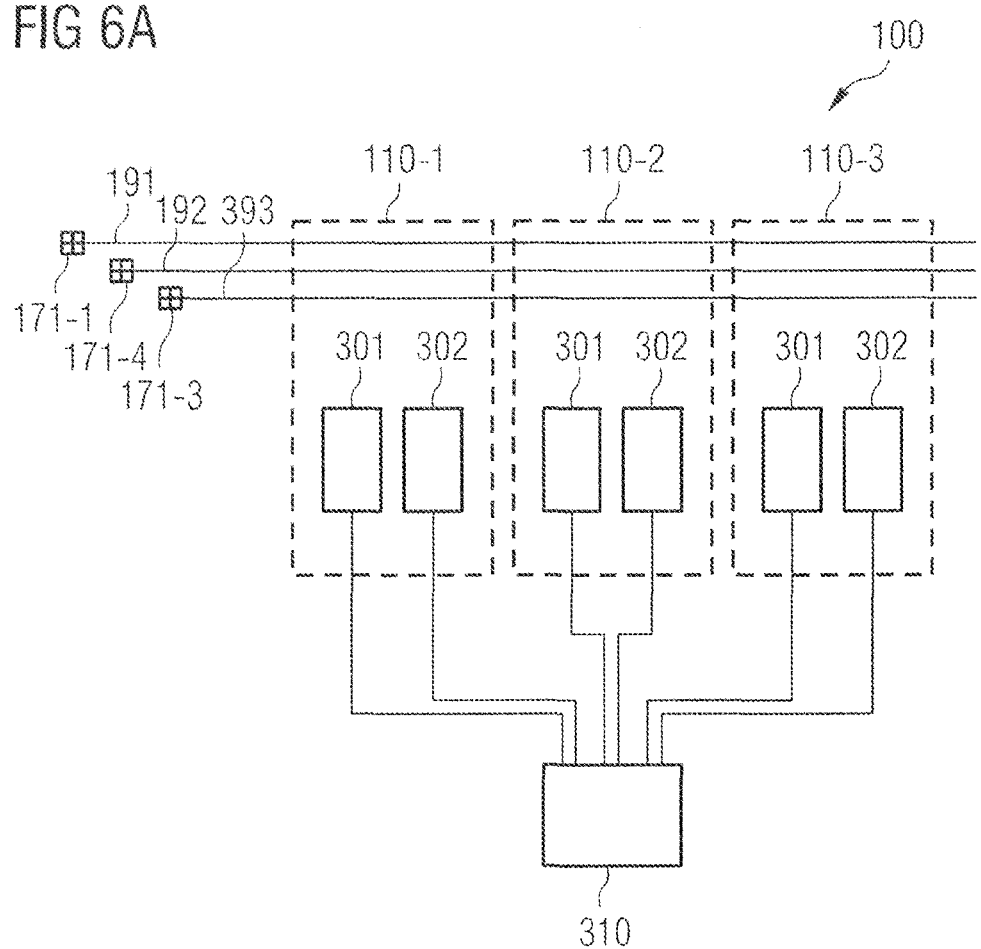
FIG. 6A is a schematic illustration of a controller configured to control the switches of FIG. 5 for various cells of the device according to various embodiments.

FIG. 6A shows an embodiment of a circuit comprising cells 100-1, 100-2, 100-3 and a controller 310. Each of the cells 100-1, 100-2, 100-3 is configured as in FIG. 3 and therefore includes switches 301 and 302. The controller 310 includes a multiplexer which can independently control the switches 301 and the further switches 302 of the plurality of cells 110-1-110-3.

It is possible to determine a leakage current between the first contact 121-1 and the second contact 121-2 of the FETs 120 of the various cells 110-1-110-3 when executing a leakage test. E.g., the leakage current may be determined before and after the gate stress. For this, a current measurement device may be provided which is connected to the common power line 191 and the common test line 393 via the respective pins 171-1, 171-3. In particular, because the controller 310 can individually control the switches 301 and the further switches 302 of the various cells 110-1-110-3, the leakage current can be individually measured for each one of the FETs 120. For this, the current flow between the common power line 191 and the common test line 393 can be measured when a single one of the switches 301 of a given one of the cells 110-1-110-3 is closed; this can be re-iterated for all cells 110-1-110-3. The leakage current can be measure before and/or after executing the gate stress.

As can be seen from FIG. 6A, the controller 393 can individually control each one of the switches 301, 302 of the various cells 110-1, 110-2. This may be implemented by providing dedicated top routing between the controller 310 and the switches 301, 302 of each one of the cells 110-1-110-3. Alternatively or additionally, this may be implemented by logically grouping the various cells 110-1-110-3 in columns and/or rows and addressing individual or subsets of cells 110-1-110-3 by selecting a respective column and/or a row. Here, neighboring cells 110-1-110-3 of the same column and/or row can be interconnected by a column and/or row control line. A matrix configuration may be employed. This may reduce the top routing.

In FIG. 6B, a further scenario is shown where the controller 310 can individually control the various switches 301.

However, the further switches 302 are cumulatively controlled. E.g., with respect to the further switches 302, it is possible to provide only a single top routing connection between the plurality of cells 110-1-110-3 and the controller 310. This may be implemented by a common control line 680 of the device 100. The further switches 302 of the various cells 110-1-110-3 may be connected to the common control line 680. The common control line 680 is also connected to the controller 310 and employed for control the further switches 302 to be in the opened or closed position.

In FIG. 6B, a scenario is shown where the device 100 includes a common control line 680 to which the further switches 302 are coupled. It is also possible that the switches 301 are coupled to the common control line 680, e.g., in addition or alternatively to the further switches 302. Then, the gate stress may be executed in parallel for the various cells 110-1-110-3.

Figure 7:
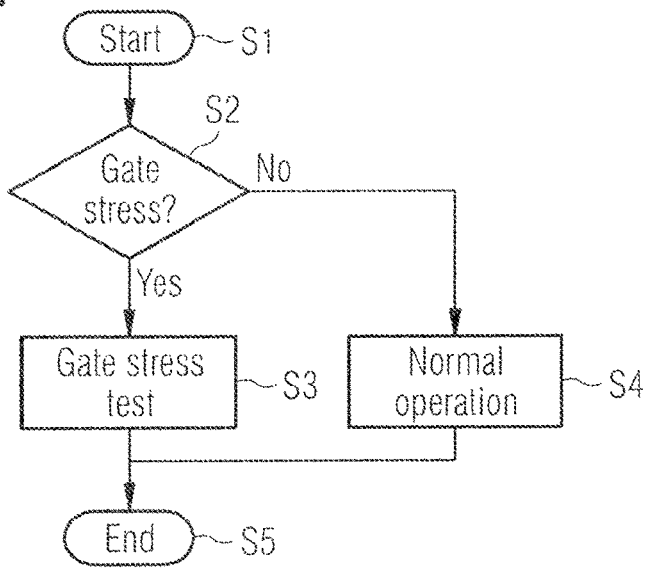
FIG. 7 is a flowchart of a method according to various embodiments.

In FIG. 7, a flowchart of a method of executing a gate stress test is shown. The method starts in step S1. In step S2, it is checked whether the gate stress operation mode should be activated or whether normal operation of the device 100 should commence.

If in step S2 it is decided that gate stress operation mode should commence, step S3 is executed. In step S3, the gate stress test is executed. Details of the gate stress operation mode are given below with reference to FIG. 8.

If in step S2 of FIG. 7 it is decided that normal operation mode of the device should commence, the method continues with step S4. Details of the normal operation mode of step S4 are given below with reference to FIG. 9. The method ends in step S5.

Figure 8:
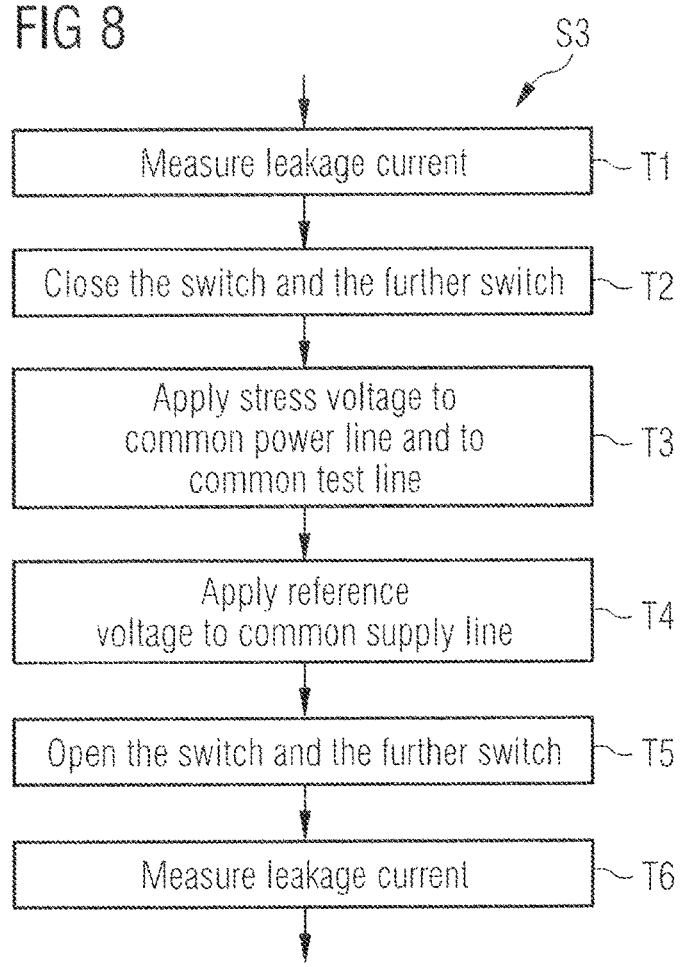
FIG. 8 is a flowchart which illustrates aspects of the method of FIG. 7 relating to the executing of a gate stress test in greater detail.

Details of the gate stress test of step S3 are illustrated in FIG. 8. First, the leakage current is measured in step T1. For this, a first terminal of an external current measurement device is connected to the common test line 393 via the pin 171-3. A second terminal of the external current measurement device is connected to the common power line 191 via the pin 171-1. For a particular cell, the switch 301 is controlled to be in the closed position. This interconnects the common power line 191 and the common test line 393 via the FET 120. The gate 121-3 of the respective FET 120 is driven such that the FET 120 opens.

The function of the current measurement device is to measure the leakage current between its first and second terminals which corresponds, due to the series connection of respective cell 110-1 and the current measurement device, the current through source and drain of FET 120.

In step T2, the switch 301 and the further switch 302 are both closed—if not already the case.

In step T3, the stress voltage is applied to, both, the common power line 191 and the common test line 393. In step T4, the reference voltage is applied to the common supply line 192. Thereby, a well-defined voltage is applied between source and drain of the FET 120 with respect to the gate 121-3 of the FET 120. The gate stress is executed for a predefined period of time. Then, in step T5, the switch 301 and the further switch 302 are opened. In step T6, the leakage current is measured again.

In FIG. 9, details of the step S4 of FIG. 7 are illustrated. First, the switch 301 is opened in step U1. Then, the further switch 302 is closed in step U2.

In step U3, the gate voltage is applied to the common supply line 192, thereby electrically interconnecting the source and drain of the FET 120. The power voltage is applied to the common power line 191 in step U4, thereby powering the load connected to the respective cell 110-1-110-3 via the interface 170 through the FET 120.

Thus, it becomes possible to apply a power voltage to the common power line 191 and, by a pre-driver of one or more of the plurality of cells 110-1-110-3, to close FET 120, thereby powering the load connected via the interface 170.

Although various implementations have been shown and described with respect to certain preferred embodiments, equivalents and modifications will occur to others skilled in the art upon the reading and understanding of the specification. The various described implementations include all such equivalents and modifications and are limited only by the scope of the appended claims.

The invention claimed is:

1. A device, comprising:
    a common power line,
    a common test line,
    a common supply line, and
    a plurality of cells,
    wherein each one of the plurality of cells is coupled to the common power line and to the common test line and comprises:
        a field-effect transistor comprising a gate, a first contact, and a second contact, the first contact being one of a source and a drain of the field-effect transistor and being coupled to the common power line, the second contact being the other one of the source and the drain,
        an interface coupled to the second contact of the field-effect transistor and configured to enable the field-effect transistor to drive a load coupled thereto, and
        a switch configured to selectively couple the second contact of the field-effect transistor with the common test line in a closed position,
        a further switch being configured to selectively couple the gate of the respective field-effect transistor with the common supply line in a closed position,
        a controller configured to control the switches of the plurality of cells to be in the closed position and control the further switches of the plurality of cells to be in the closed position, and
        at least one pin configured to apply a stress voltage to the common power line and the common test line when at least one of the switches is in the closed position.

2. The device of claim 1, wherein the controller is configured to control the switches of the plurality of cells to be in the closed position at least partly in parallel.

3. The device of claim 1,
    wherein the device further comprises a further pin being configured to apply a reference voltage to the common supply line when at least one of the further switches is in the closed position.

4. The device of claim 3,
    wherein the controller is further configured to enable powering of the load of a given cell via the common power line and via the interface by:
        controlling the switch of the given cell to be in an opened position,
        controlling the further switch of the given cell to be in the closed position,
    wherein the further pin is configured to apply a gate voltage to the common supply line, the gate voltage electrically interconnecting the first contact and the second contact of the field-effect transistor of the given cell.

5. The device of claim 3, wherein the first contact of the respective field-effect transistor of each one of the plurality of cells is the drain and wherein the second contact of the respective field-effect transistor of each one of the plurality of cells is the source, wherein the stress voltage is larger than 3 Volts, larger than 5 Volts, or larger than 7 Volts, wherein the reference voltage is at ground, wherein the switch is preferably a n-channel insulated gate field-effect transistor.

6. The device of claim 3, wherein the first contact of the respective field-effect transistor of each one of the plurality of cells is the source and wherein the second contact of the respective field-effect transistor of each one of the plurality of cells is the drain, wherein the stress voltage is at ground, wherein the reference voltage is larger than 3 Volts, larger than 5 Volts, or larger than 7 Volts, wherein the switch is a p-channel insulated gate field-effect transistor.

7. The device of claim 1, wherein each one of the plurality of cells comprises a clamper circuit coupled between the gate of the respective field-effect transistor and at least one of the first contact and the second contact of the respective field-effect transistor.

8. The device claim 1, wherein the controller comprises a multiplexer configured to serially control the switches of the plurality of cells to be in the closed position, thereby enabling to individually determine a leakage current for each one of the plurality of field-effect transistors via the common test line and/or the common power line.

9. The device of claim 1, wherein the device comprises more than 500 cells, more than 1000 cells, or more than 5000 cells.

* * * * *